US010587060B2

United States Patent
Takken et al.

(10) Patent No.: US 10,587,060 B2
(45) Date of Patent: Mar. 10, 2020

(54) ELECTRICAL CONTACTS ON THE SIDEWALL OF A CIRCUIT BOARD

(71) Applicant: International Business Machines Corporation, Armonk, NY (US)

(72) Inventors: Todd E. Takken, Brewster, NY (US); Xin Zhang, Yorktown Heights, NY (US); Yuan Yao, Tarrytown, NY (US); Andrew Ferencz, Southborough, MA (US); Paul W. Coteus, Yorktown, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/828,126

(22) Filed: Nov. 30, 2017

(65) Prior Publication Data

US 2019/0165501 A1    May 30, 2019

(51) Int. Cl.

| H01R 12/52 | (2011.01) |
|---|---|
| H01R 12/57 | (2011.01) |
| H01R 43/16 | (2006.01) |
| H05K 1/11 | (2006.01) |
| H05K 3/40 | (2006.01) |
| H05K 1/14 | (2006.01) |
| H01R 12/51 | (2011.01) |

(52) U.S. Cl.
CPC ............. *H01R 12/52* (2013.01); *H01R 43/16* (2013.01); *H05K 1/111* (2013.01); *H05K 1/14* (2013.01); *H05K 3/4007* (2013.01); *H01R 12/51* (2013.01); *H01R 12/57* (2013.01); *H05K 2201/044* (2013.01)

(58) Field of Classification Search
CPC ........ H01R 12/52; H01R 12/57; H05K 1/111; H05K 2201/044
See application file for complete search history.

(56) References Cited

U.S. PATENT DOCUMENTS

| 4,355,856 | A |  | 10/1982 | Porter |
|---|---|---|---|---|
| 5,107,586 | A | * | 4/1992 | Eichelberger ........... H01L 23/32 216/20 |
| 5,285,571 | A |  | 2/1994 | Gorczyca et al. |
| 5,426,566 | A | * | 6/1995 | Beilstein, Jr. ....... H01L 25/0652 257/686 |
| 5,515,604 | A | * | 5/1996 | Horine .................... H01R 12/52 29/830 |
| 5,561,593 | A | * | 10/1996 | Rotolante ......... H01L 23/49827 257/686 |
| 6,002,589 | A |  | 12/1999 | Perino et al. |
| 6,246,016 | B1 |  | 6/2001 | Roessler et al. |
| 6,710,266 | B2 |  | 3/2004 | Mix et al. |

(Continued)

*Primary Examiner* — William H. Mayo, III
*Assistant Examiner* — Hiram E Gonzalez
(74) *Attorney, Agent, or Firm* — Patterson + Sheridan, LLP (57) ABSTRACT

Printed circuit board (PCB), electrical structures including PCBs, and methods for making the same. One PCB structures includes: a substrate having a plurality of surfaces, including a first aerial main face (AMF), a second AMF, and a first peripheral end face (PEF), wherein the first PEF separates the first AMF from the second AMF, and a first plurality of contacts embedded in the first PEF, where each of the first plurality of contacts forms a contiguous contact with the first PEF and at least one of i) the second AMF, ii) the first AMF, and iii) another one of the plurality of surfaces.

19 Claims, 5 Drawing Sheets

(56) References Cited

U.S. PATENT DOCUMENTS

| | | |
|---|---|---|
| 6,800,942 B1 | 10/2004 | Kinsman |
| 7,180,397 B1 | 2/2007 | Busletta et al. |
| 7,420,262 B2 * | 9/2008 | Bauer ................... H01L 21/78 |
| | | 257/501 |
| 7,753,688 B1 | 7/2010 | Everson et al. |
| 8,344,842 B1 * | 1/2013 | Luzanov ............... H05K 1/141 |
| | | 336/192 |
| 8,461,693 B2 | 6/2013 | Lim et al. |
| 9,209,143 B2 * | 12/2015 | Seidemann ............ H01L 24/09 |
| 9,634,018 B2 | 4/2017 | Su et al. |
| 10,217,695 B2 | 2/2019 | Meyer et al. |
| 2008/0047137 A1 * | 2/2008 | Asahi ................ H01R 13/2414 |
| | | 29/876 |

* cited by examiner

ELECTRICAL CONTACTS ON THE SIDEWALL OF A CIRCUIT BOARD

STATEMENT REGARDING FEDERALLY SPONSORED RESEARCH OR DEVELOPMENT

This invention was made with Government support under Contract No.: B621073 awarded by Department of Energy. The Government has certain rights in this invention.

BACKGROUND

1. Field of the Invention

The present invention generally relates to printed circuit boards for electrical/electronic devices and components, and methods of assembling and attaching printed circuit boards to each other.

2. Related Art

Printed circuit boards (PCBs) are structures having a rigid, non-conductive substrate layer or a laminate of multiple substrate layers and conductive pathways for routing electric/electronic signals and electric power to a circuit assembly that is typically mounted on the PCB surface. The circuit assembly may include various electrical and electronic components and one or more devices. The conductive pathways may be located along the surface of the substrate or may be embedded on layers within a multi-layer substrate.

SUMMARY

One aspect of the present specification includes a printed circuit board (PCB) that includes: a substrate having a plurality of surfaces, including at least one surface referred to as an areal main face (AMF) and at least one surface referred to as a first peripheral end face (PEF), where the first PEF separates the AMF from at least one other surface of the plurality of surfaces, and a first plurality of contacts embedded in the first PEF, where the first plurality of contacts forms a contiguous connection extending on the first PEF and at least one of i) the at least one other of the plurality of surfaces, ii) the AMF, and iii) another one of the plurality of surfaces.

Another aspect of the present specification includes a printed circuit board (PCB) including: a substrate having a plurality of surfaces, including a first areal main face (AMF), a second AMF, and a first peripheral end face (PEF), where the first PEF separates the first AMF from the second AMF, and a first plurality of contacts embedded in the first PEF, where each of the first plurality of contacts a contiguous connection extending on the first PEF and at least one of i) the second AMF, ii) the first AMF, and iii) another one of the plurality of surfaces.

Another aspect of the present specification includes a structure including: a first printed circuit board (PCB) and a second PCB each including a substrate having a plurality of surfaces including an AMF and a first peripheral end face (PEF) a substrate having a plurality of surfaces, where the first PEF separates the first AMF from the second AMF, and a first plurality of contacts embedded in the first PEF, where each of the first plurality of contacts forms a contiguous connection extending on the first PEF and at least one of i) the second AMF, ii) the first AMF, and iii) another one of the plurality of surfaces, where the first PEF of the first PCB forms an interface with at least one of a plurality of pads on at least one surface of the second PCB.

Another aspect of the present specification includes a structure that includes: a first printed circuit board (PCB) and a second PCB each including a substrate having a plurality of surfaces, including at least one surface referred to as an areal main face (AMF) and at least one surface referred to as a first peripheral end face (PEF), where the first PEF separates the AMF from at least one other surface of the plurality of surfaces, a first plurality of contacts embedded in the first PEF of the first PCB, where the first plurality of contacts a contiguous connection extending on the first PEF of the first PCB and at least one of i) the at least one other of the plurality of surfaces of the first PCB, ii) the AMF of the first PCB, and iii) another one of the plurality of surfaces of the first PCB, where the first PEF of the first PCB forms an interface with at least one of a first plurality of pads on at least one surface of the second PCB.

Another aspect of the present specification includes a method for forming a printed circuit board (PCB) including: providing a substrate for forming a body of the PCB, having a plurality of surfaces, including at least one surface referred to as an areal main face (AMF) and at least one surface referred to as a first peripheral end face (PEF), where the first PEF separates the AMF from at least one other surface of the plurality of surfaces, isolating the first PEF for the purposes of exposing the first PEF to a photo-patterning process, and patterning a plurality of contacts on the first PEF, where at least one contact is segregated into a plurality of contacts as a result of the isolating and patterning.

DETAILED DESCRIPTION

At least one embodiment of the present specification provides a first PCB connected to a surface of second PCB, where the connection is established by a particular soldering topography. The soldering topography connects more than one surface of the first PCB to at least one surface of the second PCB by soldering together multiple electrical contacts of the first PCB to contacts on the second PCB. In contrast to other techniques, embodiments associated with this technique increase the power distribution, electrical communication, and/or mechanical stability of the combined PCB structure because multiple surfaces of the first PCB are bonded to the second PCB as a result of the distribution and/or placement of the electrical contacts on both PCBs.

Figure 1A:
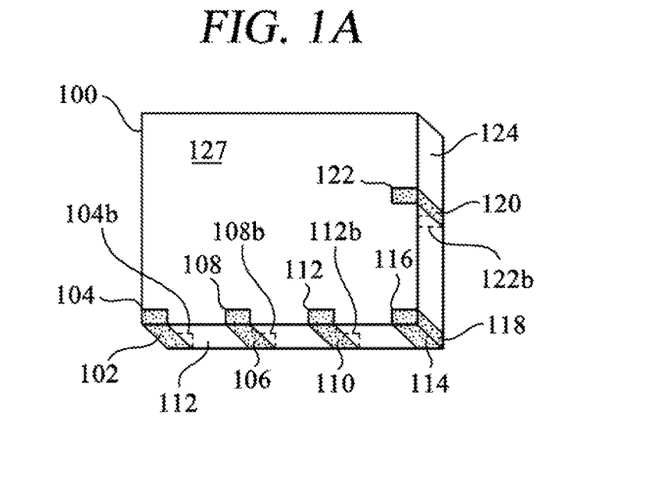
FIG. 1A illustrates a PCB structure in accordance with one embodiment of the present specification.

FIG. 1A shows at least one perspective of a PCB 100, where the PCB 100 includes one or more substrates, where in one embodiment the PCB 100 itself can be considered as at least one substrate, with a plurality of electrical contacts 102, 106, 110, and 114 on or embedded in a first peripheral end face (PEF) 112. The PCB 100 also includes electrical contacts 118 and 120 on a second PEF 124 which is perpendicular to the first PEF 112. In one embodiment, the electrical contacts 102, 106, 110, 114, 118, and 120 are formed from any metal or conductive material, including but not limited to copper, aluminum, titanium-nitride, gold, silver, etc. The PCB 100 includes at least one areal main face (AMF) 127 in contact with the at least one PEF 112, and in this embodiment, with the second PEF 124. Further, the AMF 127 establishes a plane that is perpendicular to both the first and second PEFs 112, 124. As shown, the AMF 127 is laterally longer than the first PEF 112, and includes a plurality of electrical and mechanical components thereon (all not shown), where the first PEF 112 is in direct and continuous contact with either one or both the AMF 127 and the second PEF 124. PCB 100 can also include a second AMF 128, opposite to AMF 127, as shown in FIG. 2B, where any one of the PEFs 112 and 124 separate AMF 128 from AMF 127.

In one embodiment, items 104, 104*b*, 108, 108*b*, 112, 112*b*, 116, 122 and 122*b* can be any suitable contact pads, including electrical/conductive contacts pads formed from any metal or conductive material such as copper, aluminum, titanium-nitride, gold, silver, etc. Although the pads and the electrical contacts can be considered distinct elements, in another embodiment an electrical contact and a conductive pad can be considered a single continuous connection forming a contiguous connection in association with or through one or more surfaces of the PCB 100. For example, the contact 102 and the pads 104 and 104*b* can be considered one contact linking AMF 127, the first PEF 112, and another surface not shown in FIG. 1A. Similarly, in one embodiment, contact 114, contact 118, and pad 116 can be considered one contiguous contact linking PEF 112, PEF 124, and AMF 127. In one embodiment one or more of the contacts 102, 106, etc. and one or more of the pads 104, 108, etc. can be plated electrical contacts. The contacts and pads can form a contiguous connection with multiple surfaces of the PCB 100, and can be formed using conventional photo-patterning, deposition, and plating techniques. The pads can be on or embedded in their associated surfaces.

The contacts 102, 106, 110, 114, 118, and 120 and pads 104, 104*b*, 108, 108*b*, 112, 112*b*, 116, 122 and 122*b*, in one embodiment, can connect to internal or external wiring (not shown) within or on the PCB 100, including wiring running along the AMF 127 and/or AMF 128, for the purposes of establishing connections throughout the PCB 100 and/or for mechanical robustness. In another embodiment, the contacts 102, 106, 110, 114, 118, and 120 and pads 104, 104*b*, 108, 108*b*, 112, 112*b*, 116, 122 and 122*b* can be stand-alone without a wiring connection.

Figure 1B:
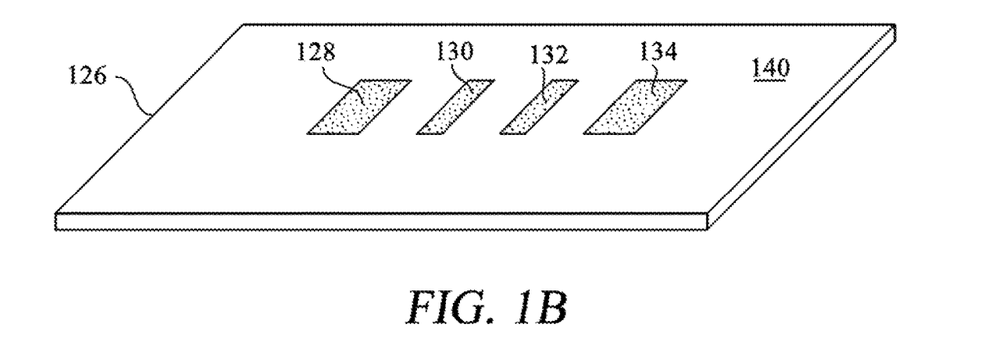
FIG. 1B illustrates a PCB structure in accordance with one embodiment of the present specification.

In one embodiment, the contact pads, e.g. 118, of one or more of the PEF surfaces, e.g. 112, provide a contact area for solder fillets such that PCB 100 can be solder attached to a second PCB (e.g., the second PCB 126 shown in FIG. 1B). In one embodiment, contact 120 and pad 122 are used to connect the PCB 100 to another device, which is not expressly shown. Contact 118 can provide an additional solder fillet area beyond that of contact 116, when contact 114 is attached to a second PCB 126. In one embodiment, as shown in FIG. 1B, items 128, 130, 132 and 134 are conducting pads or conducting contacts on the second circuit board 126 as will be discussed further below.

As shown in FIG. 1A contacts and pads can form a single contiguous connection, e.g. 104, 104*b*, and 102 forms a connection across multiple surfaces of the PCB 100, such that the contiguous connection has an exposed face on more than one surface. As such, the combined contacts 104, 104*b*, and 102 can have an exposed face on multiple surfaces, including PEF 112, AMF 127, and another surface. In another example, the contacts 116, 118 and 114 form the contiguous connection resulting in exposed faces on at least AMF 127, PEF 112, and PEF 124. As discussed below, this contiguous connection can, in one embodiment, enable a more effective mechanical and electrical connection between multiple PCBs, e.g. 100 and 126, because it provides a better connected and mechanically stable soldered interface.

As shown in FIG. 1B, PCB 126 contains one or more contacts or pads 128, 130, 132, and 134 that correspond to at least one contact 102, 106, 110 and 114, respectively, on PCB 100. That is to say the contacts or pads 128, 130, 132, and 134 have a defined spacing so that when PCB 100 is properly aligned with PCB 126, contact 102 and pad 128 can be connected, contact 106 and pad 130 can be connected, contact 110 and pad 132 can be connected, and contact 114 and pad 134 can be connected. Prior to soldering (discussed below), pads 104, 108, 112*a*, and 116 remain exposed and portions of pads 128, 130, 132, and 134 remain exposed as well. As with FIG. 1A, the PCB 126 includes one or more substrates, where in one embodiment the PCB 100 itself can be considered as at least one substrate, and an AMF 140. The PCB 126 can also include a second AMF opposite the first AMF 140 (not expressly labeled in FIG. 1B). Like the contact and pads of FIG. 1A, the pads 128, 130, 132, and 134 of FIG. 1B can be formed from any metal or conductive material, including but not limited to copper, aluminum, titanium-nitride, gold, silver, etc. In one embodiment, the pads 128, 130, 132, and 134 are plated, and can be formed using any conventional photo patterning and plating process.

As with PCB 100, the pads 128, 130, 132, and 134 of PCB 126 can connect to internal or external wiring (not shown) within or on the PCB 100, including wiring running along the AMF 140, for the purposes of establishing connections throughout the PCB 100 and/or for mechanical robustness. In another embodiment, the pads 128, 130, 132, and 134 can be stand-alone without a wiring connection.

In one embodiment, the PCB 100 and the PCB 126 are rigid PCBs having printed circuit materials including conductive pathways, e.g., conductive contacts and/or pads, for conducting electrical power or electronic signals to various electrical or mechanical devices. The PCB may be rigid and formed as a laminate of one or more layers of printed circuit material substrates in which each substrate layer is an insulating dielectric material between exposed copper layers. Laminate types include multilayer, prepreg, cored, or hollow cored. Multilayer laminate materials, may include, but are not limited to one or more plys of glass, fiberglass, wood, a plastic, or a fabric. A common type of PCB substrate is FR-4, which is a fiberglass-epoxy laminate.

In one embodiment, the width of the PEF surfaces, e.g. 112 and 124, can establish the thickness of the PCB 100, which may range from between 0.02 inches and 0.125 inches although larger PCB thicknesses are contemplated. In one embodiment, the thickness of the contacts can be between 0.0005 inches to 0.005 inches, although other dimensions are contemplated. The contacts 102, 106, 110, and 114 on the surface of the PEF 112, and the pads adjacent to the PEF 112, including 104, 108, 112, and 116, are part of one or more electrical signal networks (nets) and/or electrical power nets for delivering power to electrical/electronic or mechanical devices, or otherwise establish electrical communication with another interface, e.g., by connecting to items 128, 130, 132, and 134 on the second PCB 126. The pads and contacts that are exposed at the PEFs 112, 124 may provide a thermal contact for carrying thermal energy away from electrical/electronic or mechanical devices via an interface, e.g., by connecting to items 128, 130, 132, and 134 on the second PCB 126.

Figure 2A:
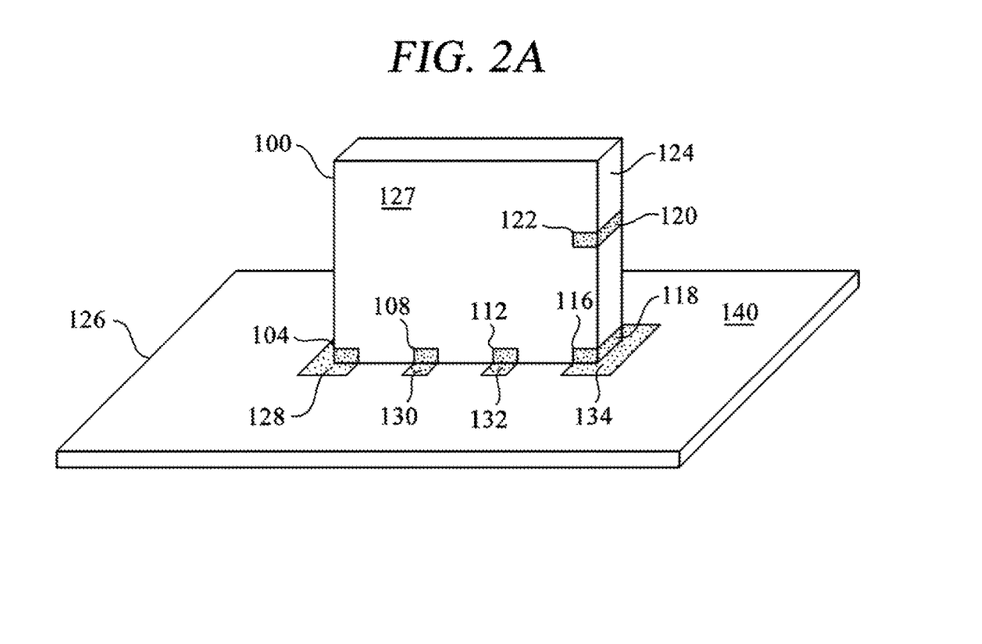
FIG. 2A illustrates a PCB structure in accordance with one embodiment of the present specification.
Figure 2B:
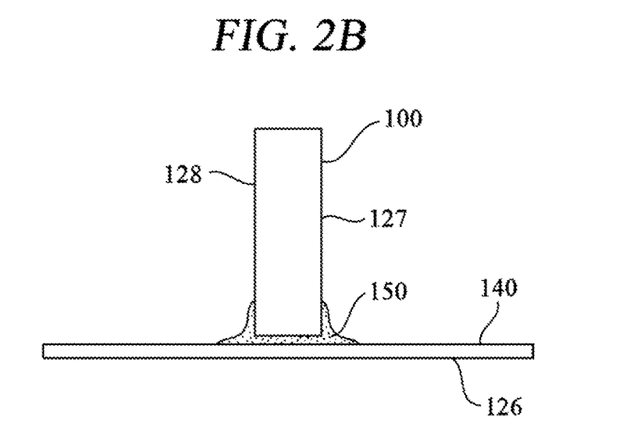
FIG. 2B illustrates an electrical structure in accordance with one embodiment of the present specification.

FIG. 2A illustrates connected or combined PCBs 100 and 126 pursuant to at least one scheme provided for above. The contacts of PCB 100 form an interface with the contacts of PCB 126. The connection can be established by a surface mounting solder assembly (as discussed further in FIG. 1B) such that the contacts 102, 106, 110, and 114 along the PEF surface 112 are mounted to corresponding electrical contact pads 128, 130, 132, and 134 located on the AMF 140 of the second PCB 126. In this embodiment, the PCB 100 is mounted in an orientation perpendicular to the plane surface of the second PCB 126, however, the contact pads and contacts on both PCB 100 and 126 can be adjusted to establish a different orientation.

In one embodiment, as shown in FIG. 2B, a soldered interface or soldered topography 150 between PCB 100 and PCB 126 is shown, where the soldered interface or topography 150 can be a triangular or trapezoidal shape that enables contiguous connection among multiple surfaces 112, 127, and 128 on the PCB 100 and the AMF 140 of PCB 126 to form the structure 200. This is possible because the contacts 102, 106, 110, and 114 along the width of PEF 112 are exposed and can be connected to one or both of the exposed faces of i) the pads 128, 130, 132, and 134 along the AMF 140 of PCB 126 and/or ii) the pads 104, 104b, 108, 108b, 112a, 112b, and 116 adjacent to the PEF 112. In other embodiments, other surfaces with exposed contacts and pads can also be connected by the soldered interface 150. For example, AMF 128 has pads 104b, 108b, 112b, and 116 adjacent to the PEF 112, and since the pads have exposed faces that can be soldered to the overall structure 200, yet another surface can be adjoined with respect to the final structure. In another embodiment, a contact 118 along PEF 124 is adjacent to PEF 112, AMF 127 and AMF 140 and associated contact 114 and pad 116 such that soldered interface 150 can connect PEF 112, PEF 124, AMF 127, and AMF 140 together, as such, a suitable soldering process can link multiple surfaces together because of the particular configuration of contacts and pads. This permits for a better distribution of power and/or electrical communication between the PCB structures and provides for a more mechanically stable connection.

In an embodiment, the contacts and/or pads on the surface of the second PCB 126, in order to form the soldered interface 150, are individually connected to a corresponding conductive contact on the PEF 112 of the first PCB 100 via an individual solder connection deposited between a surface of one or more of the electrical contact pads 128, 130, 132, and 134 of the second PCB 126 and one or more corresponding contacts 102, 106, 110, and 114 of the first PCB 100. Thereafter, one or more exposed pads 104, 104b, 108, 108b, 112a, 112b, 116, and 118 adjacent to PEF 112 can be soldered to link multiple surfaces together. For example, the complete soldered interface 150 can connect to the AMF 127 of the first PCB 100, the AMF 140 of the second PCB 126, and the PEF 112 of the first PCB 100. In another embodiment, the soldered interface 150 can connect AMF 127 of the first PCB 100, AMF 128 of the second PCB 126, and the PEF 112 of the first PCB 100. In another embodiment, the interface 150 connects to the AMF 140 of the second PCB 126, the first PEF 112 of the first PCB 100, the second PEF 124 of the first PCB 100, and the AMF 127 of the first PCB 100. In another embodiment, the soldered interface 150 can connect AMF 127 of the first PCB 100, AMF 128 of the second PCB 126, the PEF 112 of the first PCB 100, and PEF 124 of the first PCB 100. The dimensions of the PEF 112 of the PCB 100 are designed proportionate to an overall first PCB size such that the individual solder connections deposited between a surface of the electrical contact pads 128, 130, 132, and 134 of the second PCB 126 and the corresponding contacts 102, 106, 110, and 116 of the first PCB 100 provide a mechanically stable surface for mounting the first PCB 100 to the surface of the second PCB 126.

In an alternative embodiment, a pool of solder paste is placed to cover one or more of i) electrical contact pads 128, 130, 132, and 134 at the AMF 140 of the second PCB 126, ii) the contacts 102, 106, 110, and 116 of the PEF 112, and/or iii) the pads and/or contacts 104, 104b, 108, 112a, 112b, 116, 118 adjacent to the PEF 112 of the first PCB 100, so as to connect and effectively electrically short them together and create a larger electrical connection that links multiple surfaces together as described above. Again, the combined soldered connection, which links multiple surfaces of the first PCB 100 to the second PCB 126, provides for increased current capacity and better transmission of power and/or electrical communication between the PCB structures and also provides for a more mechanically stable structure.

Figure 3A:
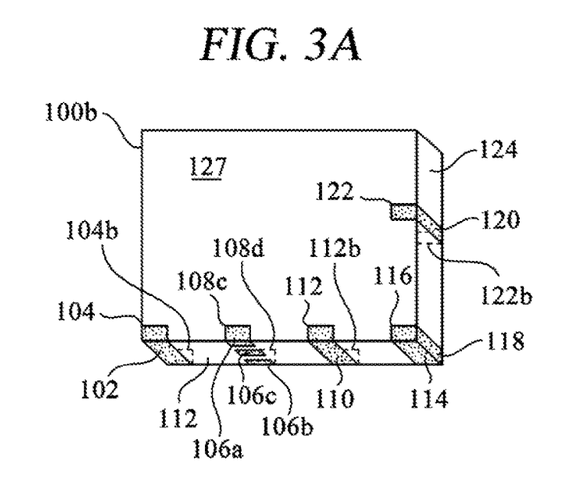
FIG. 3A illustrates a PCB structure in accordance with one embodiment of the present specification.

FIG. 3A illustrates FIG. 1A with a modification in that instead of a single contiguous formed by contacts and pads 106, 108, and 108b, FIG. 3A illustrates an embodiment where segregated electrical contacts 106a, 106b, and 106c are along a portion of the width of the PEF 112. One or more of the segregated contacts, e.g. 106a and 106c, contacts with one or more pads or contacts, e.g. 108c and 108d, to link multiple surfaces of the PCB, e.g. 112 and 127, of the PCB 100 together. The benefits of having at least one segregated grouping can include the ability to increase contact density of the PCB 100b and/or the PCB 100b in contact with another PCB, such as PCB 126b. This can enable more efficient and effective communication within the PCB 100b, particularly when individualized connection is required with respect to certain components.

Figure 3B:
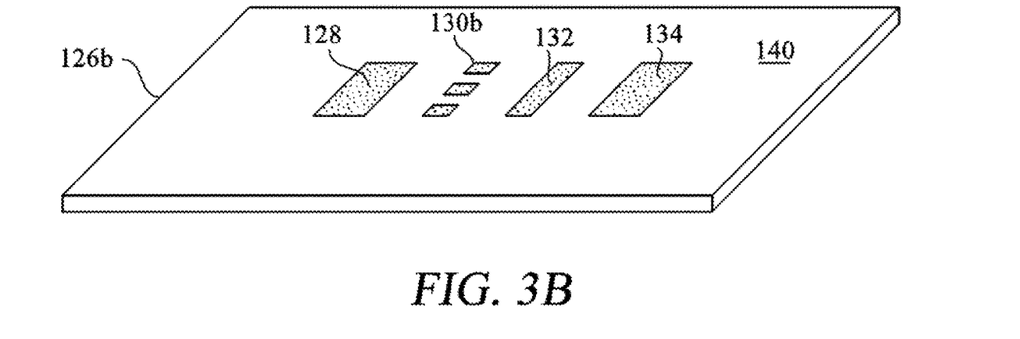
FIG. 3B illustrates a PCB structure in accordance with one embodiment of the present specification.

FIG. 3B illustrates FIG. 1B modified to enable connection with FIG. 3A. Specifically, the grouping of pads 130b contains a pad that corresponds to each contact 106a, 106b, and 106c to enable a connection between PCB 100b and PCB 126b.

Figure 4A:
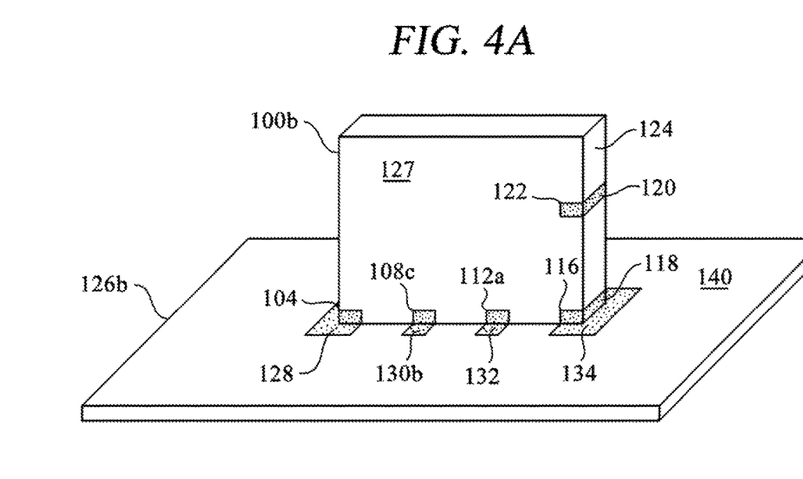
FIG. 4A illustrates a PCB structure in accordance with one embodiment of the present specification.
Figure 4B:
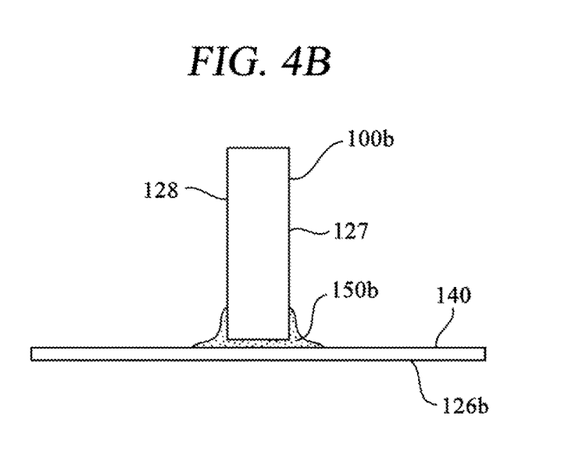
FIG. 4B illustrates an electrical structure in accordance with one embodiment of the present specification.

The soldering techniques mentioned above, in any combination, can be employed to form the structure 400 illustrated in FIG. 4A and FIG. 4B, where the soldering interface 150b still enables connection of multiple surfaces of PCB 100b and PCB 126b. In one embodiment, the segregated contacts 106a, 106b, and 106c are soldered to their respective pads in group 130b on surface 140 using any suitable soldering techniques as discussed above or as otherwise may be suitable, and with the remaining pads and contacts along one or more of the surfaces PEF 112, AMF 127, AMF 128 and/or PEF 124. This embodiment ensures that the particular value of the segregated formation and connection, as may be beneficial in a particular application, is fully taken advantage of, while also allowing a soldering topography 150b to link multiple surfaces together to better establish an electrical connection for power transmission and/or electrical communication and/or to make the structure 400 mechanically stable.

Figure 5A:
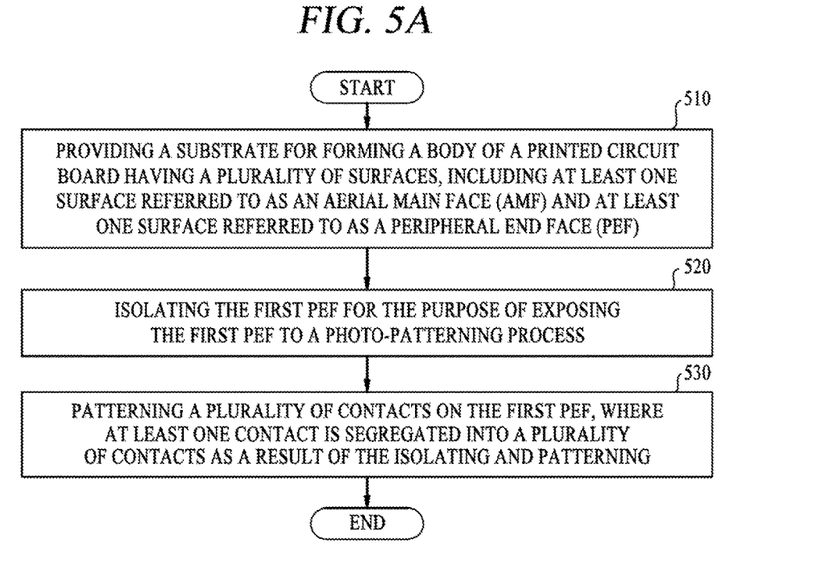
FIG. 5A illustrates a method for making a PCB structure in accordance with the present specification.

FIG. 5A illustrates a method for forming segregated contacts, e.g. 106a, 106b, and 106c along a PEF, e.g. 112, of a PCB, e.g. 100. Any suitable photo patterning, deposition, and plating technique may be applied to create the segregated contacts. However, with respect to this embodiment, shortcomings with respect to conventional techniques are overcome, in that a PEF surface, e.g. 112, is isolated for patterning and plating in order to create a particular configuration, including the segregated contacts. At block 510, a substrate of forming a body of the PCB, having a plurality of surfaces is provided. The surfaces can include at least one AMF and at least one PEF, where the at least one PEF separates the AMF from at least one other surface of the plurality of surfaces. According to this embodiment, one or more isolation steps can take place, where in block 520, the first PEF is isolated for the purposes of exposing the first PEF to a photo-patterning process to form the respective contacts and pads, including segregated contacts, e.g. 106a, 106b, and 106c. At block 530, the isolating performed at block 520 enables a patterning and plating process to create one or more contacts along the width of the PEF, including but not limited to the segregated contacts.

Figure 5B:
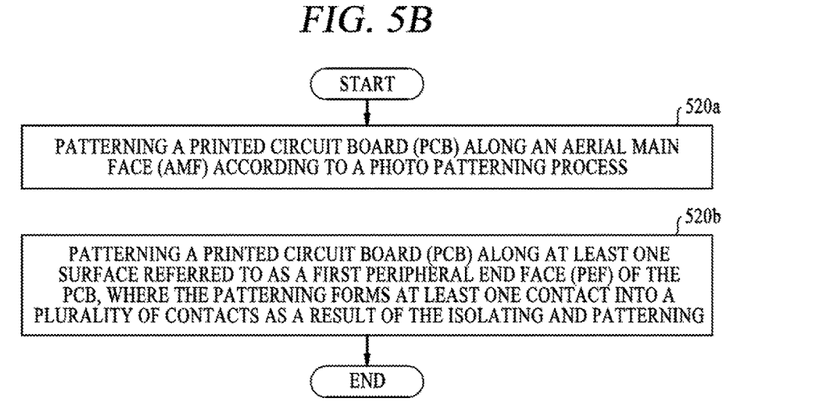
FIG. 5B illustrates a method for making a PCB structure in accordance with the present specification.

According to an embodiment, as illustrated in FIG. 5B, at block 510a, the entire PCB structure, e.g. 100, undergoes a first patterning and plating process, e.g. any suitable material for protecting a material from photo patterning, such as a photoresist material, is applied to the entire PCB structure along an AMF, e.g. 127, except for the areas where at least some of the contacts and pads, e.g. 102 and 104, will be located for the final structure. The photo patterning process may leave openings for the relevant contacts and pads to be placed therein by any suitable deposition and plating process. After patterning and plating, at block 520a, the PEF 112 can be oriented and, in one embodiment, isolated for a second patterning and plating process, where the area of the PEF 112 is patterned and plated to create the segregated pads, e.g. 106a, 106b, and 106c. In one embodiment, block 510a can be omitted, and the entire process can begin by starting with 520a, ensuring that the patterning, deposition, and plating process creates a pattern for all of the contacts and pads, e.g. 102, 104, etc., in addition to the contacts 106a, 106b, and 106c. In one embodiment, the process can omit segregated contacts, and the photo patterning and plating can be applied directly to the PEF, e.g. 112, to form any kind of contact, where the isolating is done for efficiency purposes and to ensure better development of contacts and pads in association with the surface that will form an interface with another surface, e.g. the relevant surface being the PEF, e.g. 112. In one embodiment, where more than one patterning step takes place, for example along an AMF first and then a PEF, or if multiple patterning is required across a single surface, such as PEF, the plating can occur in one step to for efficiency and cost-effectiveness.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

In the following, reference is made to embodiments presented in this disclosure. However, the scope of the present disclosure is not limited to specific described embodiments. Instead, any combination of the following features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the following aspects, features, embodiments and advantages are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

While the foregoing is directed to embodiments of the present invention, other and further embodiments of the invention may be devised without departing from the basic scope thereof, and the scope thereof is determined by the claims that follow.

What is claimed is:

1. A printed circuit board (PCB) comprising:
a substrate having a plurality of surfaces, comprising a first areal main face (AMF), a second AMF opposite to the first AMF on the substrate, a first peripheral end face (PEF), and a second PEF, wherein the first PEF separates the first AMF from the second AMF and is adjacent and perpendicular to the second PEF, wherein the second PEF separates the first AMF from the second AMF, and wherein a first portion of the first AMF, a second portion of the second AMF, a third portion of the first PEF, and a fourth portion the second PEF define a corner of the substrate where the third portion shares edges with the first portion, the second portion, and the fourth portion; and
a contact formed on four surfaces of the substrate that contiguously extends across the first portion of the first AMF, the second portion of the second AMF, the third portion of the first PEF, and the fourth portion of the second PEF.

2. The PCB of claim 1 further including:
a plurality of contacts embedded in the second PEF.

3. The PCB of claim 2, wherein each contact of the plurality of contacts forms a contiguous connection across the second PEF and onto the first AMF.

4. The PCB of claim 3, wherein at least one contact of the plurality of contacts forms a contiguous contact across the second PEF and onto the second AMF.

5. The PCB of claim 2, wherein each contact of the first plurality of contacts has a plurality of exposed faces for forming a corresponding plurality of contacts with a surface of another device.

6. The PCB of claim 2 ,further comprising:
a first plurality of pads that is embedded in the first AMF, adjacent to the first PEF, and connected to the plurality of contacts.

7. The PCB of claim 2, further comprising:
a second plurality of pads that is embedded in the second AMF, adjacent to the second PEF, and connected to the plurality of contacts.

8. The PCB of claim 2, wherein each exposed face of the plurality of contacts is configured to form a solder connection.

9. The PCB of claim 8, further comprising: a segmented contact running across the first PEF as a plurality of portions.

10. The PCB of claim 1, wherein the substrate is a fabric.

11. A structure comprising:
a first printed circuit board (PCB) including a substrate having a plurality of surfaces including:
a first areal main face (AMF), having a first portion and a second portion different than the first portion;
a second AMF, having a third portion and a fourth portion different than the third portion;
a first peripheral end face (PEF), wherein the first PEF separates the first AMF from the second AMF, the first PEF having a fifth portion and a sixth portion different than the fifth portion; and
a second PEF that is adjacent and perpendicular to the first PEF, wherein the second PEF separates the first AMF from the second AMF, the second PEF having a seventh portion and an eighth portion different than the seventh portion, wherein the seventh portion contacts the fifth portion to define a corner of the first PCB that includes the first portion, the third portion, the fifth portion, and the seventh portion; and
a first plurality of contacts contiguously extending across a surface of the first PEF, wherein at least one contact of the first plurality of contacts contiguously extends across the first portion, the third portion, the fifth portion, and the sixth portion; and
wherein the first PEF of the first PCB forms an interface with at least one of a first plurality of pads on at least one surface of a second PCB.

12. The structure according to claim 11, wherein at least one contact of the first plurality of contacts forms a contiguous connection across the first PEF and onto the first AMF of the first PCB.

13. The structure according to claim 11, wherein the interface between the first PCB and the second PCB is a soldered interface.

14. The structure according to claim 13, wherein a mating surface of the second PCB on which the soldered interface is formed is parallel to the first PEF and perpendicular to the first AMF and the second AMF of the first PCB.

15. The structure according to claim 14, wherein the soldered interface provides a connection with the first AMF, the second AMF, and the first PEF of the first PCB.

16. The structure according to claim 15 further comprising:
a second plurality of pads that is embedded in the second AMF, adjacent to the first PEF, and connected to the first plurality of pads, wherein the contiguous soldered interface includes a connection with the first plurality of contacts, the first plurality of pads, and the second plurality contacts to form the contiguous connection.

17. The structure according to claim 14, wherein the soldered interface is trapezoidal to enable one connection across multiple faces of the first PCB.

18. The structure according to claim 11, further comprising:
a segmented contact running across the first PEF as a plurality of non-contiguous portions.

19. A method for forming a printed circuit board (PCB) comprising:
providing a substrate forming a body of the PCB, having a plurality of surfaces, including: a first surface referred to as an areal main face (AMF), having a first portion and a second portion;
a second surface perpendicular to the first surface and referred to as a first peripheral end face (PEF), having a third portion and a fourth portion;
a third surface perpendicular to the first surface and the second surface referred to as a second PEF, having a fifth portion and a sixth portion;
a fourth surface perpendicular to the second surface and the third surface, having a seventh portion and an eight portion; and wherein the first portion, the third portion, the fifth portion and the seventh portion define a corner of the substrate; and
patterning a plurality of contacts that extends across a surface of the first PEF, wherein at least one contact of the first plurality of contacts contiguously extends across the first portion, the third portion, the fifth portion, and the seventh portion.

* * * * *